(12) United States Patent
Erbar et al.

(10) Patent No.: US 6,377,311 B1
(45) Date of Patent: Apr. 23, 2002

(54) METHOD FOR COMPENSATING VIDEO SIGNAL INTERFERENCES USING CONCOMITANTLY TRANSMITTED DIGITAL DATA

(75) Inventors: Maximilian Erbar, Villingen-Schwenningen; Jinan Lin, Ottobrun, both of (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/458,219

(22) Filed: Dec. 9, 1999

(30) Foreign Application Priority Data

Dec. 10, 1998 (DE) ......................................... 198 57 039

(51) Int. Cl.$^7$ ................................................ H04N 5/21
(52) U.S. Cl. ........................................ 348/607; 348/465
(58) Field of Search ............................... 348/607, 914, 348/611, 614, 465, 468; 375/229, 232; H04N 5/21

(56) References Cited

U.S. PATENT DOCUMENTS

| | | | | |
|---|---|---|---|---|
| 4,928,287 A | * | 5/1990 | Tanaka | ........................ 375/231 |
| 5,973,752 A | * | 10/1999 | Matsunaga | ................... 348/614 |
| 6,239,843 B1 | * | 5/2001 | Gaudreau | .................... 348/465 |

FOREIGN PATENT DOCUMENTS

| | | | | |
|---|---|---|---|---|
| EP | 463 781 A2 | 1/1992 | ............. | H04N/5/21 |
| FR | 44 01 786 A1 | 7/1995 | ............. | H04L/1/20 |
| FR | 44 41 789 C1 | 11/1995 | .......... | H03H/17/00 |
| FR | 33 27 915 C1 | 1/1997 | ........... | H04L/25/03 |

* cited by examiner

*Primary Examiner*—Sherrie Hsia
(74) *Attorney, Agent, or Firm*—Joseph S. Tripoli; Joseph J. Laks; Ronald H. Kurdyla

(57) ABSTRACT

A method for recovering a video signal uses an adaptive equalizer, the characteristics of which are adjusted to the conditions of a transmission channel by using the digital data signals that are concomitantly transmitted in addition to the analogue signal components in a video signal. This adjustment is then used for analogue signal components of the video signals. A teletext signal can advantageously be used for the adjustment.

3 Claims, 1 Drawing Sheet

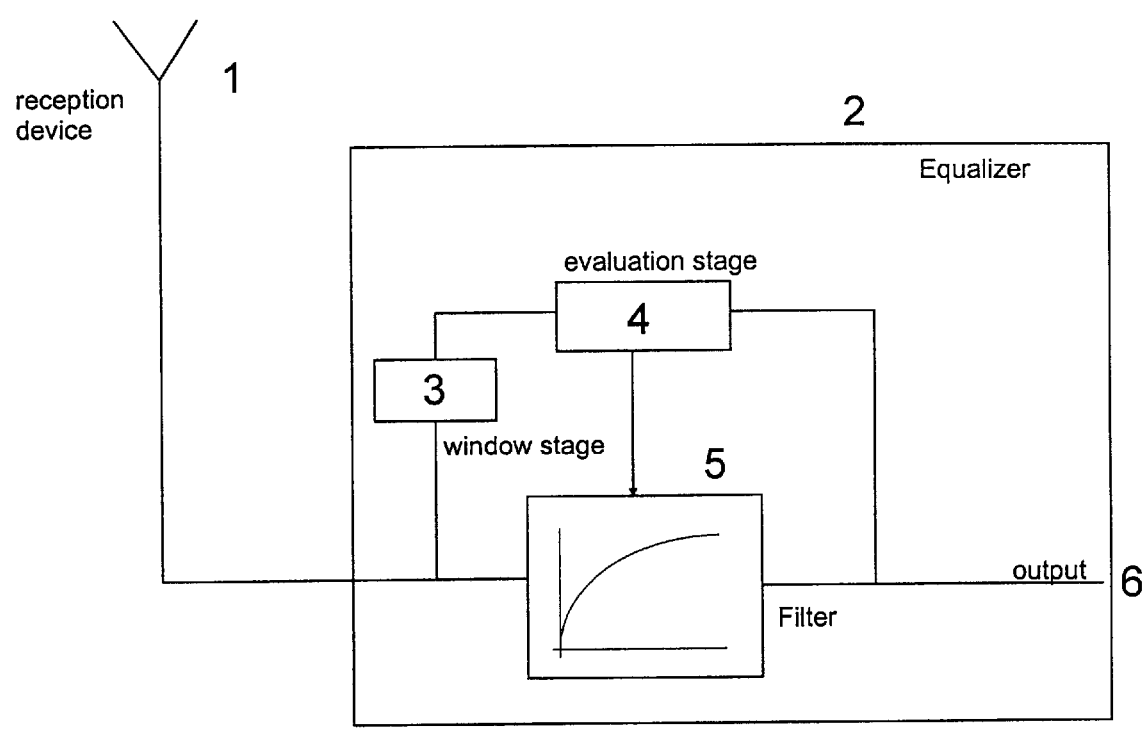

METHOD FOR COMPENSATING VIDEO SIGNAL INTERFERENCES USING CONCOMITANTLY TRANSMITTED DIGITAL DATA

FIELD OF THE INVENTION

The invention relates to a method for the recovery of a video signal.

BACKGROUND OF THE INVENTION

Video signals which are transmitted via a channel are, as a rule, influenced by the channel characteristics. This applies, in particular, to channels which are susceptible to interference, such as the terrestrial transmission of TV signals. Signal interference may occur due to ambient influences on the transmission path.

There is thus an interest in compensating for this interference in the receiver and in obtaining an optimal reproduction quality.

In the case where the channel characteristics are known in the receiver, interference can be eliminated by means of suitable compensation measures, such as e.g. an equalizer. However, knowledge of the channel characteristics is not provided e.g. in the case of terrestrial transmission. In order to ensure interference-free reception even in the case of such transmission channels which are subject to interference, an adaptive equalizer can be used. It is then necessary, however, to transmit a reference signal with the useful signal, from which reference signal the corresponding compensation parameters are then derived by the adaptive equalizer. For capacity reasons, however, such reference signals are not prescribed by the transmitter.

SUMMARY OF THE INVENTION

The invention is based on the object of specifying a method for the recovery of a video signal which, without an additional reference signal, to the greatest possible extent eliminates channel interference which influences the quality of the video signal.

According to the invention, an adaptive equalizer is used which is trained by the digital data signals, such as e.g. teletext data, that are concomitantly transmitted in a video signal.

An adaptive equalizer adapts itself independently in order to compensate for unknown or time-variable channel characteristics. An input signal which is interfered with by the channel is changed by the adaptive equalizer until a desired output signal is present. Since adaptive equalizers cannot judge when a desired analogue output signal is present given an analogue input signal, the digital data signal that is concomitantly transmitted with the analogue input signal is advantageously used for the adjustment of the adaptive equalizer.

It is preferable for the adaptive equalizer to be adapted to the optimal reception condition during the transmission duration of the digital data signals and for this adjustment then to be maintained during the transmission duration of the analogue signals.

DETAILED DESCRIPTION OF THE DRAWINGS

Furthermore, an exemplary embodiment for a circuitry realization for the method according to the invention is described with reference to the drawing.

A signal is fed to an adaptive equalizer 2 via a reception device 1. The adaptive equalizer 2 comprises, in particular, an adjustable filter unit 5, via which the video signal is fed to an output 6.

In addition, the video signal is fed via a window stage 3 to an evaluation stage 4 for digital data signals. A control output of the evaluation stage 4 is connected to the adjustable filter unit 5. The output of the evaluation stage likewise leads to the output 6 of the adaptive equalizer 2. Further processing stages (not shown) for the video signal are connected to the output 6.

In order to eliminate the influence of channel-dictated interference on the video signal, the digital data signals are used to modify the filter characteristics of the adjustable filter unit 5 in such a way as to minimize the interference for the output signal.

By means of a window stage 3 and an evaluation stage 4, the operation for altering the filter characteristics of the adjustable filter unit 5 is limited to the period of time in which digital data signals are present. As soon as the digital data signals are no longer present, the filter characteristics of the adjustable filter unit 5 are frozen for example via a control line by means of a corresponding signal.

The method according to the invention is suitable for any signal transmission methods and for signals which contain not only analogue information but also digital data signals which have a sufficiently high statistical probability.

What is claimed is:

1. A method for recovery of video signals with analogue signal components and digital data components, wherein said digital data components are transmitted concomitantly to said analogue signal components for the purpose of providing additional information to the TV user, said method comprising the steps of:

providing the video signals to an adaptive equalizer;

windowing the video signals for the separation of the digital data components;

generating a control output from the separated digital data components;

applying the video signals to a filter within the adaptive equalizer; and adjusting characteristics of the filter based upon the control output for correcting the analogue signal components.

2. The method according to claim 1, wherein digital teletext data are used as the digital data components of the video signals.

3. The method according to claim 1, wherein the filter characteristics are altered only when digital data components are present.

* * * * *